(12) United States Patent
Bobrov et al.

(10) Patent No.: US 9,725,802 B2
(45) Date of Patent: Aug. 8, 2017

(54) METHOD FOR MAKING PET CONTAINERS WITH ENHANCED SILICON DIOXIDE BARRIER COATING

(71) Applicant: Graham Packaging Company, L.P., York, PA (US)

(72) Inventors: Sergey B. Bobrov, Aurora, IL (US); Mark D. Schneider, St. Charles, IL (US)

(73) Assignee: GRAHAM PACKAGING COMPANY, L.P., Lancaster, PA (US)

( * ) Notice: Subject to any disclaimer, the term of this patent is extended or adjusted under 35 U.S.C. 154(b) by 115 days.

(21) Appl. No.: 14/538,298

(22) Filed: Nov. 11, 2014

(65) Prior Publication Data
US 2016/0130697 A1    May 12, 2016

(51) Int. Cl.
*H05H 1/24*    (2006.01)
*C23C 16/02*    (2006.01)
(Continued)

(52) U.S. Cl.
CPC .......... *C23C 16/0209* (2013.01); *B65D 23/02* (2013.01); *C23C 16/045* (2013.01); *C23C 16/401* (2013.01); *C23C 16/46* (2013.01); *C23C 16/511* (2013.01); *C23C 16/513* (2013.01); *C23C 16/50* (2013.01)

(58) Field of Classification Search
CPC ... C23C 16/401; C23C 16/513; C23C 16/045; C23C 16/0209; C23C 16/46; C23C 16/50; C23C 16/511
See application file for complete search history.

(56) References Cited

U.S. PATENT DOCUMENTS

| | | | |
|---|---|---|---|
| 4,233,022 A | 11/1980 | Brady et al. | |
| 4,357,296 A | 11/1982 | Hafele | |

(Continued)

FOREIGN PATENT DOCUMENTS

| | | |
|---|---|---|
| CN | 85101194 A | 10/1986 |
| CN | 1159975 A | 9/1997 |

(Continued)

OTHER PUBLICATIONS

International Search Report and Written Opinion for corresponding international patent application No. PCT/US2015/049310 mailed Dec. 23, 2015 by the European Patent Office as International Searching Authority.

(Continued)

*Primary Examiner* — Kelly M Gambetta
(74) *Attorney, Agent, or Firm* — Stradley Ronon Stevens & Young, LLP

(57) ABSTRACT

A process for applying a silicon oxide barrier coating to a PET container, wherein the PET container comprises a wall having an inner surface and an outer surface, the process comprising the steps of: (a) heating a PET container such that at least the outer surface is at a temperature of from about 200° F. to about 383° F.; (b) forming a coated PET container by applying at least one silicon oxide barrier layer on at least the inner surface of the PET container while the temperature of at least the outer surface of the PET container is at a temperature of from about 200° F. to about 383° F.; and (c) cooling the coated PET container after step b.

4 Claims, 3 Drawing Sheets

(51) Int. Cl.
| | |
|---|---|
| C23C 16/513 | (2006.01) |
| C23C 16/511 | (2006.01) |
| B65D 23/02 | (2006.01) |
| C23C 16/04 | (2006.01) |
| C23C 16/40 | (2006.01) |
| C23C 16/46 | (2006.01) |
| C23C 16/50 | (2006.01) |

(56) References Cited

U.S. PATENT DOCUMENTS

| | | |
|---|---|---|
| 4,476,170 A | 10/1984 | Jabarin |
| 4,512,948 A | 4/1985 | Jabarin |
| 4,522,779 A | 6/1985 | Jabarin |
| 4,535,025 A | 8/1985 | Jabarin |
| 4,603,066 A | 7/1986 | Jabarin |
| 4,713,270 A | 12/1987 | Jabarin et al. |
| 4,790,741 A | 12/1988 | Takakusaki et al. |
| 4,839,127 A | 6/1989 | Ajmera et al. |
| 4,891,178 A | 1/1990 | Ajmera et al. |
| 5,500,261 A | 3/1996 | Takei et al. |
| 5,501,590 A | 3/1996 | Orimoto et al. |
| 5,562,960 A | 10/1996 | Sugiura |
| 5,670,224 A | 9/1997 | Izu et al. |
| 5,829,614 A | 11/1998 | Collette et al. |
| 6,464,683 B1 | 10/2002 | Samuelson et al. |
| 6,485,669 B1 | 11/2002 | Boyd et al. |
| 6,485,670 B1 | 11/2002 | Boyd et al. |
| 6,514,451 B1 | 2/2003 | Boyd et al. |
| 6,749,415 B2 | 6/2004 | Boyd et al. |
| 6,767,197 B2 | 7/2004 | Boyd et al. |
| 6,841,117 B1 | 1/2005 | Smith et al. |
| 6,919,107 B2 | 7/2005 | Schwarzenbach et al. |
| 7,033,656 B2 | 4/2006 | Nahill et al. |
| 7,157,139 B2 | 1/2007 | Salsman et al. |
| 8,067,070 B2 | 11/2011 | Klein et al. |
| 8,372,491 B2 | 2/2013 | Rostaing |
| 8,394,476 B2 | 3/2013 | Hama et al. |
| 8,507,063 B2 | 8/2013 | Schneider et al. |
| 2001/0017429 A1 | 8/2001 | Takahashi et al. |
| 2002/0006487 A1 | 1/2002 | O'Conner et al. |
| 2003/0186006 A1 | 10/2003 | Schmidt et al. |
| 2005/0136149 A1 | 6/2005 | Krishnakumar et al. |
| 2005/0140036 A1 | 6/2005 | Hirota et al. |
| 2006/0293421 A1 | 12/2006 | Reitz et al. |
| 2007/0047080 A1 | 3/2007 | Stover et al. |
| 2007/0065615 A1 | 3/2007 | Odle et al. |
| 2007/0085243 A1* | 4/2007 | Doudement ............ B29C 49/68 264/521 |
| 2007/0244550 A1 | 10/2007 | Eidenschink |
| 2009/0284421 A1 | 11/2009 | Glukhoy et al. |
| 2010/0298738 A1* | 11/2010 | Felts .................. B05D 1/62 600/576 |
| 2011/0143123 A1* | 6/2011 | Ito ..................... B32B 27/36 428/323 |
| 2011/0204067 A1 | 8/2011 | Schneider et al. |
| 2012/0076965 A1* | 3/2012 | Silvers ............... B29C 49/0005 428/36.92 |
| 2012/0231182 A1 | 9/2012 | Stevens et al. |
| 2013/0302591 A1 | 11/2013 | Timmerman et al. |
| 2013/0316108 A1* | 11/2013 | Shimizu ............... B65D 1/40 428/35.7 |

FOREIGN PATENT DOCUMENTS

| | | |
|---|---|---|
| CN | 1805991 A | 7/2006 |
| EP | 0559103 | 9/1993 |
| EP | 0860265 | 8/1998 |
| EP | 0709485 | 10/1998 |
| EP | 1155807 | 11/2001 |
| EP | 0764514 B1 | 2/2002 |
| EP | 1 208 957 | 5/2002 |
| GB | 2108899 | 5/1983 |
| JP | 62-71622 | 4/1987 |
| JP | H10286874 A | 10/1998 |
| JP | 2002 361774 A * | 12/2002 |
| JP | 2002361774 | 12/2002 |
| WO | 97/32708 | 9/1997 |
| WO | 01/96448 | 12/2001 |
| WO | 2004/113414 A1 | 12/2004 |
| WO | 2008/016114 | 2/2008 |
| WO | 2014/008138 | 1/2014 |

OTHER PUBLICATIONS

"Vitrification and devitrification of the rigid amorphous fraction in poly(ethylene terephthalate)" Maria Cristina Righetti and Maria Laura Di Lorenzo, e-polymers May 2009, No. 053, http://www.e-polymers.org (http://www.e-polymers.org/journal/papers/mcrighetti_310509.pdf) ISSN 1618-7229.

Timothy J. Boyd, A Dissertation entitled "Transient Crystallization of Poly (ethylene terephthalate) Bottles", The University of Toledo Aug. 2004.

* cited by examiner

US 9,725,802 B2

METHOD FOR MAKING PET CONTAINERS WITH ENHANCED SILICON DIOXIDE BARRIER COATING

BACKGROUND OF THE INVENTION

Technical Field of the Invention

The present invention relates to plastic containers having enhanced barrier properties and, in particular, plastic containers having enhanced barrier properties retained after thermal processing such as, for example, in applications where the container and its contents are heated up to 270° F. Such applications include sterilization, pasteurization or retort processes. The present invention also relates to a process of manufacturing such plastic containers.

Background Art

Blow molding processes for forming PET containers are well known in the art. PET plastic containers have replaced or provided an alternative to glass containers for many applications. Some food products that are packaged in blow molded PET containers must at least filled at a high temperature, i.e., up to 195° F. and, in some instances, must be processed using pasteurization or retort at a temperature of up to 230° F. and above. Pasteurization and retort methods are frequently used for sterilizing solid or semi-solid food products, e.g., pickles and sauerkraut. The products may be packed into the container along with a liquid at a temperature less than 180° F. and then sealed and capped, or the product may be placed in the container that is then filled with liquid, which may have been previously heated, and the entire contents of the sealed and capped container are subsequently heated to a higher temperature. As used herein, "high-temperature" pasteurization and retort are sterilization processes in which the product is exposed to temperatures of from about 176° F. to about 270° F.

Pasteurization and retort differ from hot-fill processing by including heating the filled container to a specified temperature, typically greater than 200° F., until the contents of the filled container reach a specified temperature, for example 175° F., for a predetermined length of time. That is, the external temperature of the hot-filled container may be greater than 200° F. so that the internal temperature of a solid or semi-solid product reaches approximately 175° F. Pasteurization and retort processes may also involve applying overpressure to the container. The rigors of such processing present significant challenges for the use of plastic containers having high gas barrier requirements to fluids such as, for example, oxygen (ingress) and carbon dioxide (egress). One excellent barrier material is a silicon oxide based barrier coating that is applied typically to the inside of the container using commercially available vacuum chemical vapor deposition methods. The Barrier Improvement Factor (BIF) for these freshly coated containers can be as high as 200×, or higher, compared to the same container without the silicon oxide coating. During pasteurization and retorting processes, the container is typically distorted by the high temperatures and internal pressure in the container that can stress the silicon oxide coating and form micro fractures in the coating. This results in a deterioration of the BIF by 20× or greater, thus yielding a net result BIF of not greater than 10×. Ultimately, of course, the deteriorated BIF translates into a shortened shelf life for the packaged product.

Accordingly, there is a need in the art for a process to produce a blow molded PET container that has a silicon oxide based barrier coating that can withstand the rigors of a pasteurization or retort process without sacrificing a significant portion of the BIF gained by application of the coating.

SUMMARY OF THE INVENTION

In one aspect, the present invention provides a process for applying a silicon oxide barrier coating to a PET container, wherein the PET container comprises a wall having an inner surface and an outer surface, the process comprising the steps of: (a) heating a PET container such that at least the outer surface is at a temperature of from about 200° F. to about 383° F.; (b) forming a coated PET container by applying at least one silicon oxide barrier layer on at least the inner surface of the PET container while the temperature of at least the outer surface of the PET container is at a temperature of from about 200° F. to about 383° F.; and (c) cooling the coated PET container after step b.

In another aspect, the present invention provides a PET container comprising a silicon oxide barrier coating and having a barrier improvement factor (BIF) as a result of the silicon oxide barrier coating, wherein the PET container retains at least 17% of BIF after the PET container is exposed to a thermal sterilization process.

In yet another aspect, the present invention provides a coated PET container, wherein the PET container comprises a wall having an inner surface and an outer surface, made by a process comprising the steps of: (a) heating a PET container such that at least the outer surface is at a temperature of from about 200° F. to about 383° F.; (b) applying at least one silicon oxide barrier layer on at least the inner surface of the PET container while the temperature of at least the outer surface of the PET container is at a temperature of from about 200° F. to about 383° F. to form the coated PET container; and (c) cooling the coated PET container after step b, wherein the coated PET container has a barrier improvement factor (BIF) for oxygen, and wherein the BIF for oxygen is substantially retained after the coated PET container is exposed to a thermal sterilization process.

BRIEF DESCRIPTION OF THE DRAWINGS

The foregoing and other features and advantages of the invention will be apparent from the following, more particular description of a preferred embodiment of the invention, as illustrated in the accompanying drawings wherein like reference numbers generally indicate identical, functionally similar, and/or structurally similar elements.

DETAILED DESCRIPTION OF THE INVENTION

Figure 1:
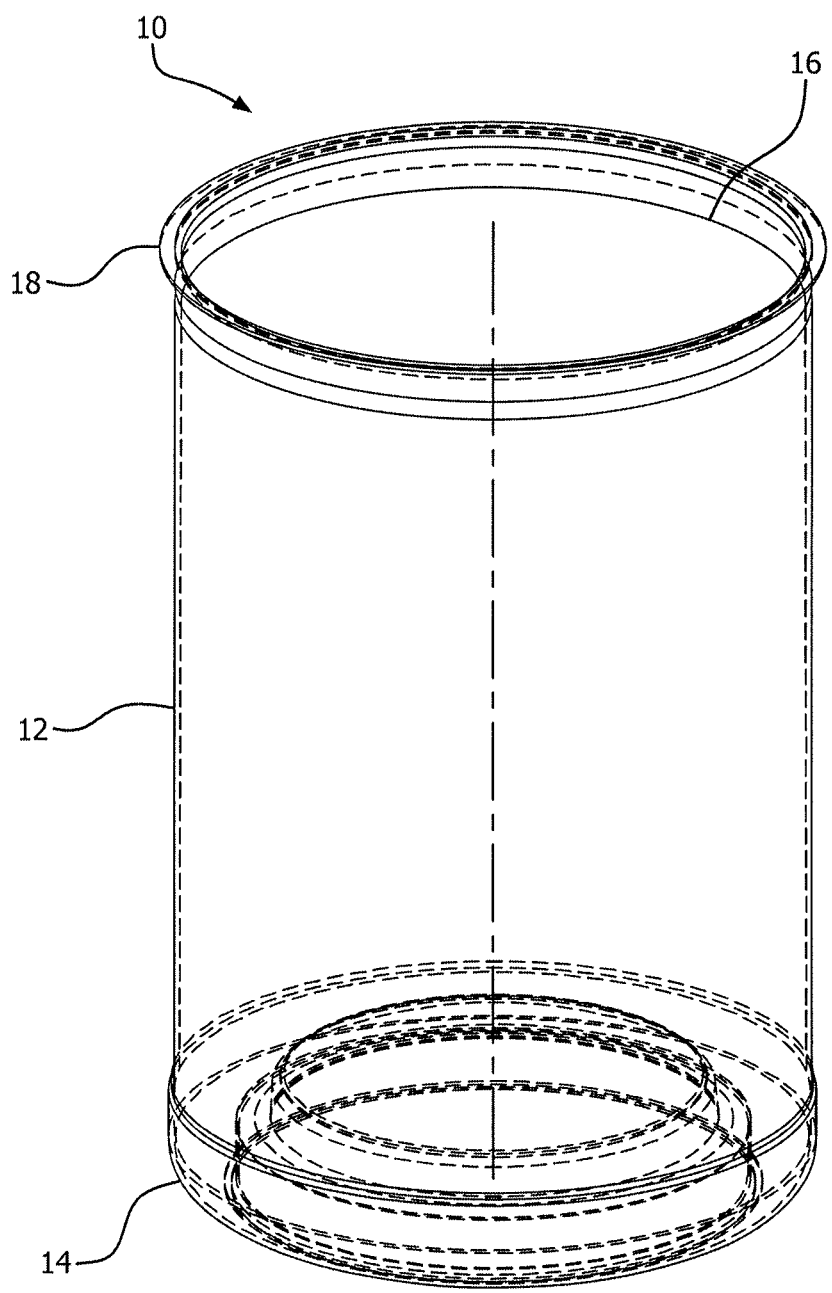
FIG. 1 is a perspective view of a can-type PET container according to the present invention.

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention. All references cited herein are incorporated by reference as if each had been individually incorporated.

The present invention provides a process for applying a silicon oxide barrier coating to a PET container, wherein the PET container comprises a wall having an inner surface and an outer surface, the process comprising the steps of: (a) heating a PET container such that at least the outer surface is at a temperature of from about 200° F. to about 383° F.; (b) forming a coated PET container by applying at least one silicon oxide barrier layer on at least the inner surface of the PET container while the temperature of at least the outer surface of the PET container is at a temperature of from about 200° F. to about 383° F.; and (c) cooling the coated PET container after step (b).

The process of the present invention can be performed on any container made of a polyester resin such as, for example, poly(ethylene)terephthalate (PET), having enhanced thermal properties while still providing a container with high clarity. Suitable polyester resins include, for example, homopolymers of poly(ethylene)-phthalate, copolymers of poly(ethylene)terephthalate, poly(ethylene)isophthalate, poly(ethylene)naphthalate, and poly(dimethylene)terephthalate, poly(butylene)terephthalate. In preferred embodiments, the containers of the present invention comprise PET. Preferably, the PET has an intrinsic viscosity of from about 0.72 dL/g to about 0.86 dL/g. Suitable PET resins include bottle grade PET resins such as, for example, any of the LASER+® resins sold by the DAK Americas, and CLEAR TUF® resins sold by M&G Polymers.

The PET containers of the present invention can have any geometry, shape or size. For example, PET containers according to the present invention can be round, oval, polygonal, and irregular. Suitable containers can be a jar-type, can-type, carafe, wide mouth and any other type container known to those of ordinary skill in the art. Suitable features of the containers can include pressure absorbing features, grip enhancing features, shoulders, bumpers, finishes, chimes, standing rings, necks and others know to those of ordinary skill in the art. Such containers comprise a wall having an inner surface and an outer surface separated by a thickness of the PET polymer.

The process of the present invention can be performed on a PET container that has been freshly made or on a PET container that has been made, cooled, and stored and/or transported. In preferred embodiments, the process of the present invention employs a blow molded PET container made to structurally withstand pasteurization and retort processes according to U.S. patent application Publication No. 2012/0076965 and U.S. Pat. No. 8,507,063, the contents of which are incorporated herein by reference in their entireties. Such containers typically comprise a wall having a density of between about 1.370 g/cc and 1.385 g/cc, a heat-induced crystallinity of from about 18% to about 25%, and a strain-induced crystallinity of from about 55% to about 75%, that when filled with a liquid having a temperature of from about 212° F. to about 270° F., will not experience a change in volume of greater than 3%, more preferably not greater than 2% and, most preferably, not greater than 1%.

The process of the present invention comprises the step of heating a PET container to a surface temperature of from about 200° F. to about 383° F. prior to the application of a silicon oxide barrier coating. This step will also be referred to herein as a "conditioning" step. The heat for the conditioning step may be applied by any means known to those skilled in the art such as, for example, hot air generated by a heat gun, infrared heaters, or combinations thereof. The preferred source of heat for use in the heating step of the method of the present invention is an infrared heater or a series of infrared heaters in a "tunnel" or chamber to better contain the emitted heat. Exemplary infrared heating devices suitable for use in connection with the present invention include, for example, those commercially available from Protherm™ (Brandon, Minn.) and Axon's radiant Thermo-Ray™ heat tunnels (Axon Styrotech (USA), Raleigh, N.C.).

In preferred embodiments, the PET container, prior to application of a silicon oxide coating, can be heated to elevate at least the outer surface temperature of the wall of the container to at least 200° F. and, more preferably up to as high as 383° F. In one preferred embodiment, the heat is applied evenly around the container's circumference. To effect such heating, a heating tunnel equipped with rotary elements can be employed to providing rotation to the container to assure uniformity of the container's thermal exposure around its circumference. In other preferred embodiments, the heating (i.e., conditioning) step comprises heating the PET container to a temperature preferably of from about 200° F. to about 383° F. throughout the wall, more preferably to a temperature of from about 225° F. to about 383° F. throughout the wall, and most preferably to a temperature of from about 250° F. to about 383° F. throughout the wall. The phrase "throughout the wall" as used herein means that, for a particular zone of temperature, that temperature is achieved from the outer surface of the wall to the inner surface of the wall.

The heating elements can be set to the same temperature or to different temperatures along the vertical axis of the container to create different heating "zones." Different heating zones can allow for "tailored" heating to different sections of the container to ultimately create maximum benefit where needed to achieve maximum BIF retention. For example, referring to FIG. 1, a PET "jar" container 10 may comprise a finish 12, a shoulder 14, a barrel 16, a heel 18 and a base 20. The thicker sections such as the shoulder 14, barrel 16 and heel 18 may require higher surface temperatures to better condition the container for application of a silicon oxide coating. For example, the shoulder 14, barrel 16 and heel 18 sections may be exposed to temperatures exceeding 275° F. and up to 383° F., while the base may only be heated to 212° F. and the finish to 140° F. Other packaging articles may require different temperature zones which can be determined by the ordinarily skilled artisan.

As a guide, it is preferred that the zones are heated to a temperature that does not exceed the onset temperature of significant molecular change as measured by an enthalpy change vis Differential Scanning calorimetry (DSC). As used herein, the term "enthalpy change" refers to the amount of energy released (exothermic, negative) or absorbed (endothermic, positive) by the substance when the molecular change occurs. An example of such enthalpy change is a polymer's melting point and/or glass transition temperature, which can be different in different sections of the same PET container as a result of differences in polymer morphology in each section.

Figure 2:
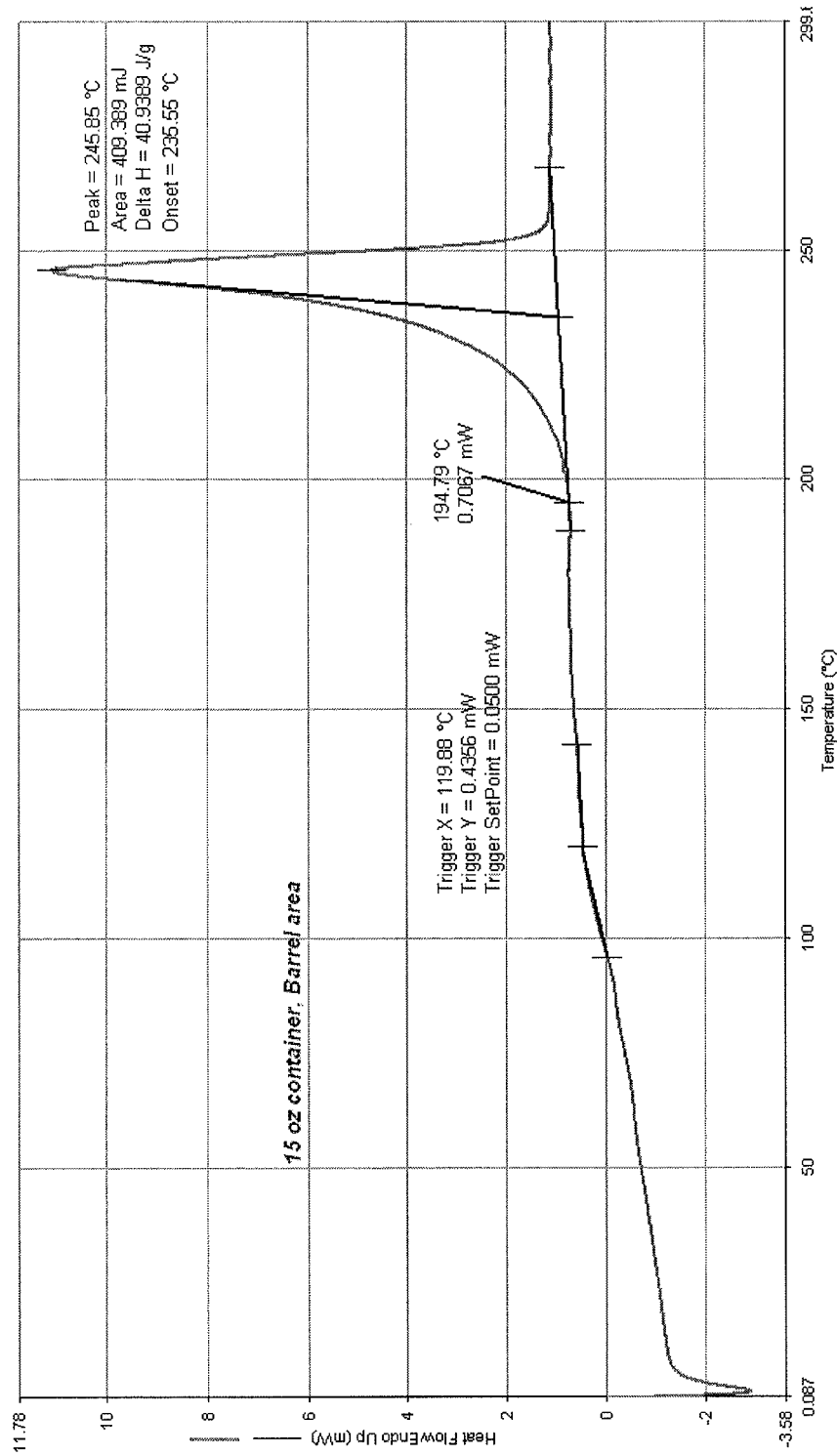
FIG. 2 is a DSC thermogram of PET material forming the barrel section of a 15 oz container.
Figure 3:
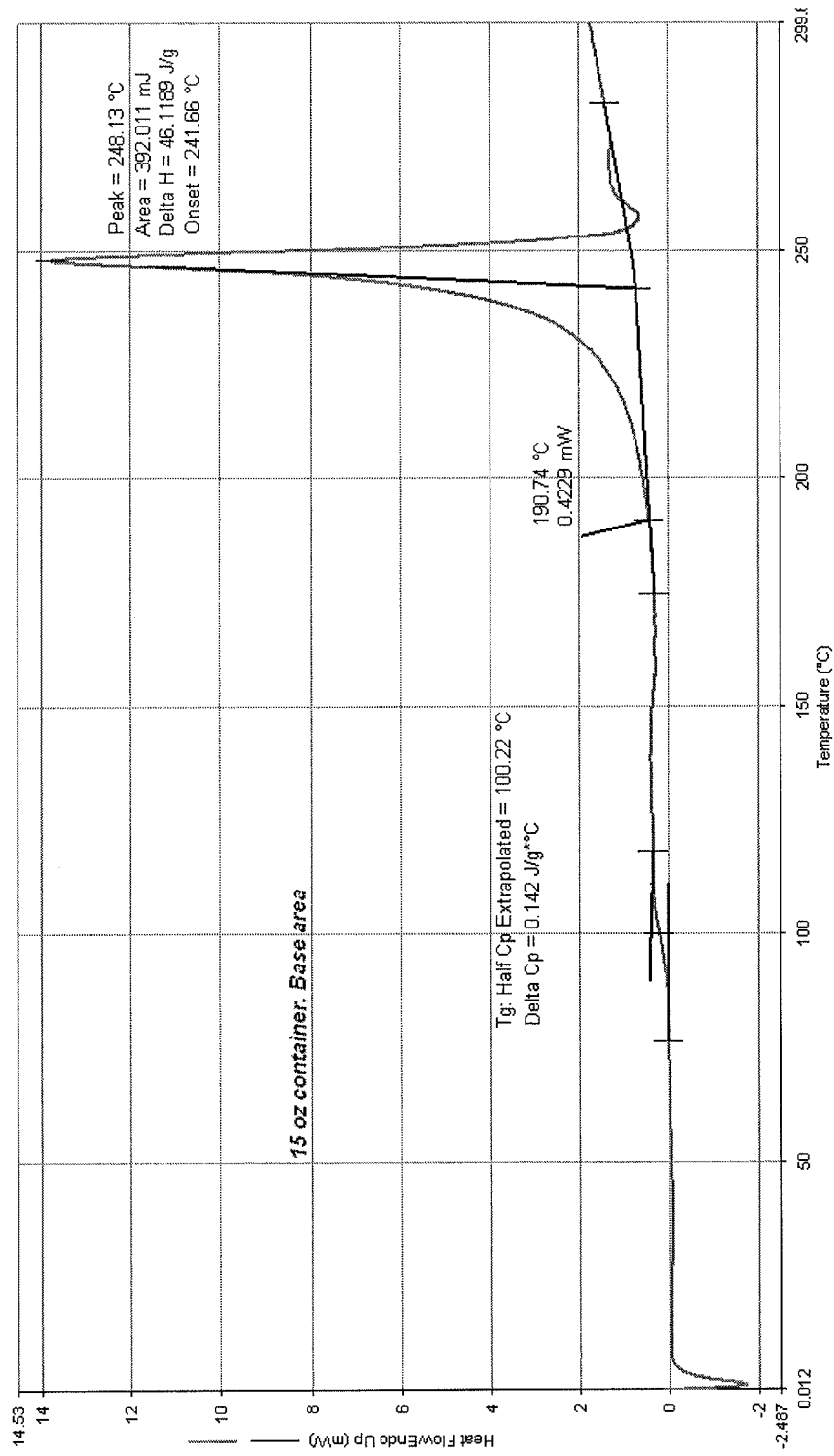
FIG. 3 is a DSC thermogram of the base area around the gate of the same container from which the sample analyzed in FIG. 3 was taken.

DSC is a tool that can be employed to determine the target conditioning temperature in different zones of the container such that the conditioning temperature does not exceed a significant enthalpy change for the corresponding section of the PET container. For example, FIG. 2 is a DSC thermogram of PET material forming the barrel section of a 15 oz container made according to the method disclosed in U.S. patent application Publication No. 2012/0076965. FIG. 2 shows a first appreciable transformation in the polymer (typically the start of melting) occurs at about 383° F. (shown as 194.79° C.); thus, this area can be heated up to 383° F. without affecting the integrity of the container. FIG. 3 is a DSC thermogram of the base area around the gate of the same container from which the sample analyzed in FIG. 2 was taken. The thermogram of FIG. 3 shows a first appreciable transformation in the polymer, i.e., a glass transition transformation, at about 212° F. (shown as 100.22° C.); thus, this area of the container can be heated to about 212° F. or below without affecting the integrity of the container. The objective of this "profiling" along verticle sections of the PET container is to maximize the thermal expansion of the polymer in each section of the PET container prior to the application of the silicon oxide barrier coating as is explained below.

The process of the present invention comprises the step of forming at least one silicon oxide barrier coating on at least the inner surface of the wall of the PET container while the temperature of at least the outer surface of the PET container is at a temperature of from about 200° F. to about 383° F. Typically, silicon oxide barrier coatings are applied to PET containers by a chemical vapor deposition (CVD) method and, preferably, by a plasma enhanced chemical vapor deposition (PECVD) method, a technique in which the silicon oxide barrier film is deposited. The process generally comprises introducing the desired barrier material or precursor to the desired barrier material in gas form near the PET container and adding energy until the barrier gas or precursor gas disassociates into a plasma state. A vacuum condition may be present to allow the process to take place at temperatures low enough to prevent thermal damage to the PET container. Without intending to be bound by any particular theory, it is believed that the disassociated particles solidify upon striking the surface of the PET container due to a chemical reaction with the reagents and adhere to the surface of the container and is promoted by the polarity of the polymer to create the silicon oxide barrier layer. Additionally, other suitable types of deposition processes may be employed to apply a barrier coating to the container.

The silicon oxide barrier coating is preferably deposited on the inside of the PET container. However, an external barrier coating may also be provided. Additionally, it is preferred to provide a silicon oxide barrier film to the container, although other types of films, such as those produced by utilizing acetylene or a number of epoxy thermoset materials, may be used.

Any suitable means known in the art to initiate plasma can be employed in the present invention. One method of PECVD suitable for use in accordance with the present invention is described in U.S. Pat. No. 5,670,224, which is incorporated herein by reference. The method described in U.S. Pat. No. 5,670,224 includes a method of depositing, by microwave plasma enhanced chemical vapor deposition, a modified, silicon oxide, barrier coating on PET container substrate. The method includes the steps of 1) providing an evacuable deposition chamber having a deposition region defined therein; 2) providing a source of microwave energy; 3) providing a PET substrate (e.g., a container) within the deposition region in the deposition chamber; 4) evacuating the deposition chamber to a sub-atmospheric pressure; 5) performing a plasma pretreatment of the PET substrate; 6) introducing a precursor gaseous mixture, which includes at least a silicon-hydrogen containing gas, an oxygen containing gas and a gas containing at least one element selected from the group consisting of germanium, tin, phosphorus, and boron, into the deposition region within the deposition chamber; 7) directing microwave energy from the source of microwave energy to the deposition region, thereby creating a plasma in the deposition region by interaction of the microwave energy and the precursor gaseous mixture; 8) depositing from the plasma onto the PET substrate a coating of material which provides the coated substrate with barrier properties greater than the non-coated substrate; and 9) introducing a sufficient flow rate of oxygen-containing gas into the precursor gaseous mixture to eliminate the inclusion of silicon-hydrogen bonds into the deposited coating. U.S. Pat. No. 5,670,224, however, discloses that because plasma deposition is inherently a high temperature process, substrates must be intermittently cooled so that destruction of the substrate is avoided. Moreover, U.S. Pat. No. 5,670,224 is silent regarding surface temperatures of the substrate prior to application of the barrier coating.

Another method of PECVD suitable for use in accordance with the present invention is described in U.S. patent application Publication No. 2012/0231182, which is incorporated herein by reference. U.S. patent application Publication No. 2012/0231182 discloses a method of treating containers using radio frequency energy to disassociate chemical precursors which recombine depositing a film on surfaces near the reaction or treating the surfaces of the container (e.g., sterilization, texturizing, etc.). A chamber was developed that integrates a method to deliver chemical precursors into the chamber volume, a mechanism to exhaust the chamber volume, an electrode assembly to disassociate the chemical precursors and produce a chemical reaction by which a film is deposited on the interior surface of the container.

Manufacturing equipment for performing the barrier coating process may be purchased through a number of commercial sources. For example, the following companies manufacture commercial barrier coating equipment (followed by the trade name designated by each company for their respective barrier coating equipment and/or process, if any): Sidel (ACTIS), Krones/Leybold (BestPet), Tetra Pak (Glaskin), Nissei, PPG (Bairocade), and KHS Plasmax.

The process of the present invention also comprises the step of cooling the PET container after application of the barrier coating, wherein the coated PET container has a barrier improvement factor (BIF). The cooling is preferably accomplished by simply allowing the containers to equilibrate to room temperature in the ambient air.

The BIF of a coated PET container made according to the process of the present invention can refer to either the barrier improvement with respect to oxygen ingress or with respect to carbon dioxide egress. The BIF with respect to oxygen, for example, is preferably measured by the following methods.

BIF/Oxygen

Oxygen flux of bottle samples at ambient relative humidity, at one atmosphere pressure, and at 23° C. can be measured with a Mocon OxTran model 2/60 (MOCON Minneapolis, Minn.) or Oxygen Permeation Analyzer, model 8701, SysTech/Illinois Instruments (Chicago, Ill.). A Ultra High Purity (UHP) nitrogen was used as the carrier gas, and ambient air (20.9% oxygen) was used as the test gas. Prior to testing, specimens were conditioned with UHP nitrogen. The test was continued until a steady base line was obtained where the oxygen flux changed by less than one percent for a 20-minute cycle. The test ended when the flux reached a steady state where the oxygen flux changed by less than 1% during a 20 minute test cycle when conducted in Normal Atmospheric Conditions. Oxygen Permeation results are measured and recorded as $cm^3$/package/day. To measure the Barrier Improvement Factor or "BIF," a control bottle containing no oxygen barrier is measured at the same time as the test bottles under identical conditions. The BIF is calculated by dividing the oxygen permeation of the control bottle, by the oxygen permeation of the test bottle. Thus, by way of example, if an uncoated monolayer PET container exhibits an oxygen transmission (ingress) of 0.030 cm$^3$/package/day, and the same container now coated with a silicon oxide coating exhibits an oxygen transmission (ingress) of 0.003 cm$^3$/package/day, then the BIF is 0.030/0.003=10.

In accordance with the present invention, the procedure is repeated to a container having been exposed to a thermal sterilization process such as, for example, pasteurization or retort.

Without intending to be bound by any particular theory, it is believed that the heating or conditioning step expands or elongates the PET container prior to deposition of the silicon oxide barrier layer so that the silicon oxide barrier layer is deposited on the expanded container. This creates a construct where the PET container substrate is expanded proportionally to the coefficient of thermal expansion of the resin but the silicon oxide barrier coating is not expanded at the time the coating is deposited. Upon cooling, the PET container "shrinks" to its "normal" size and, in doing so, the silicon oxide barrier layer is compressed and becomes more closely packed or dense. Accordingly, it is believed that the compressed silicon oxide barrier coating is able to absorb the stresses created in part from the package contents' response to the high temperatures experienced during pasteurization or retort processes as the PET container again expends proportionally to the coefficient of thermal expansion caused by the internal pressure in the container.

Practically, the result of the process of the present invention is a PET container that retains at least 17% of the BIF after exposure to a thermal sterilization process (e.g., pasteurization or retort) relative to the BIF first obtained by applying the silicon oxide barrier coating and cooling the container, i.e., prior to exposure to a thermal sterilization process. The inventors have found that retention of the BIF of the PET container after exposure to a thermal sterilization process is dependent on the temperature of the conditioning step. For example, retention of the BIF was found to be at least 17% and as much as 35% for a PET container conditioned to 200° F., at least 61% and as much as 121% for a PET container conditioned to 225° F., at least 64% and as much as 125% for a PET container conditioned to 250° F., and at least 82% and as much as 160% for a PET container conditioned to 275° F., as illustrated in the following Table 1. As used herein, "125%" means that not only was the BIF fully retained but was 25% better than the freshly coated container, i.e., prior to a exposure to a thermal process such as pasteurization or retort. As used herein, "160%" means that not only was the BIF fully retained but was 60% better than the freshly coated container, i.e., prior to a exposure to a thermal process such as pasteurization or retort.

TABLE 1

Average retained BIFs of four (4) containers for each of the preheated temperatures in the range from 200° F. to 275° F. as a function of recession of oxygen diffusion per unit of time.

|  | 200° F. | 225° F. | 250° F. | 275° F. |
| --- | --- | --- | --- | --- |
| Max. | 35% | 121% | 125% | 160% |
| Mean | 21% | 76% | 79% | 102% |
| Min. | 17% | 61% | 64% | 82% |

According to the process of the present invention, the above-mentioned BIF retention is typically experienced after exposure to thermal sterilization processes such as pasteurization and retort having temperatures of up to about 356° F. Preferably, the temperature of the thermal sterilization ranges from about 212° F. to about 356° F.

EXAMPLES

The containers of Table 1 are 15 oz PET thermally resistant blow molded containers were made according to the process disclosed in U.S. patent application Publication No. 2012/0076965. The containers of Table 1 were preheated (i.e., conditioned) to the stated temperatures prior to application of a silicon oxide coating and, after cooling, were subjected to a thermal sterilization process. The thermal sterilization process occurred in a pressure cooker, which reached 235° F. after 20 minutes at a pressure of 1.1-1.2 atm. The results listed in Table 1 are the average of 4 samples analyzed for each conditioning temperature.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. While the invention is described with respect to a wide mouth container, the function of the panel curvatures according to the invention should work with a standard finish (i.e., not a wide mouth neck with a finish). It is therefore to be understood that, within the scope of the claims and their equivalents, the invention may be practiced otherwise than as specifically described.

We claim:

1. A process for applying a silicon oxide barrier coating to a PET container, wherein the PET container comprises a wall having an inner surface and an outer surface, the process comprising the steps of:
   a. heating a PET container such that at least the outer surface is at a temperature of from 225° F. to about 383° F.;
   b. forming a coated PET container by applying at least one silicon oxide barrier layer on at least the inner surface of the PET container while the temperature of at least the outer surface of the PET container is at a temperature of from 225° F. to about 383° F.; and
   c. cooling the coated PET container after step b, wherein the heating step comprises the use of a heating tunnel through which the PET containers travel, and wherein the heating tunnel comprises from two to six heat zones of different temperatures located along a vertical axis of the containers.

2. The process of claim 1 wherein the heating step comprises heating the PET container to a surface temperature of from about 250° F. to about 383° F. throughout the wall.

3. The process of claim 1 wherein the forming step comprises:
   i. forming a vacuum in a chamber in which at least one PET container is situated;
   ii. adding a silicon oxide forming monomer reaction gas to at least the inner surface of the wall of the PET container; and iii. exposing the PET container to plasma energy to deposit the at least one layer of silicon oxide on at least the inner surface of the wall of the PET container.

4. The process of claim 1 wherein the heating tunnel comprises rotary elements to rotate the containers to ensure even heat exposure circumferentially.

* * * * *